(12) United States Patent
Takeuchi et al.

(10) Patent No.: US 12,261,020 B2
(45) Date of Patent: *Mar. 25, 2025

(54) PLASMA PROCESSING APPARATUS AND PLASMA PROCESSING METHOD

(71) Applicant: TOKYO ELECTRON LIMITED, Tokyo (JP)

(72) Inventors: Takahiro Takeuchi, Miyagi (JP); Ken Kobayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 815 days.

This patent is subject to a terminal disclaimer.

(21) Appl. No.: 17/474,530

(22) Filed: Sep. 14, 2021

(65) Prior Publication Data

US 2022/0084788 A1   Mar. 17, 2022

(30) Foreign Application Priority Data

Sep. 14, 2020 (JP) .................................. 2020-154149

(51) Int. Cl.
*H01J 37/32* (2006.01)

(52) U.S. Cl.
CPC .. *H01J 37/32146* (2013.01); *H01J 37/32183* (2013.01); *H01J 2237/334* (2013.01)

(58) Field of Classification Search
CPC ........... H01J 2237/334; H01J 37/32146; H01J 37/32183

USPC ...................................................... 219/121.36
See application file for complete search history.

(56) References Cited

U.S. PATENT DOCUMENTS

| 2015/0072530 A1 | 3/2015 | Kim et al. |
| 2019/0098740 A1 | 3/2019 | Yamazawa et al. |
| 2021/0358757 A1* | 11/2021 | Shoeb ................ H01J 37/3053 |

FOREIGN PATENT DOCUMENTS

| JP | 2013-135159 A | 7/2013 |
| JP | 2019-067503 A | 4/2019 |

* cited by examiner

*Primary Examiner* — Dana Ross
*Assistant Examiner* — James F Sims, III
(74) *Attorney, Agent, or Firm* — XSENSUS LLP

(57) ABSTRACT

A plasma processing apparatus includes: a chamber; first and second matching circuits; a first RF generator that generates a first RF pulsed signal including pulse cycles in which each cycle includes first, second, and third periods, the first RF pulsed signal has first, second, and third power levels in the first, second, and third periods, respectively; a second RF generator that generates a second RF pulsed signal including the pulse cycles in which the second RF pulsed signal has fourth and fifth power levels in the first period and one of the second and third periods, respectively; and a third RF generator that generates a third RF pulsed signal including the pulse cycles in which the third RF pulsed signal has sixth and seventh power levels in the second period and one of the first and third periods, respectively.

12 Claims, 5 Drawing Sheets

PLASMA PROCESSING APPARATUS AND PLASMA PROCESSING METHOD

CROSS-REFERENCE TO RELATED APPLICATION

This application is based on and claims priority from Japanese Patent Application No. 2020-154149 filed on Sep. 14, 2020 with the Japan Patent Office, the disclosure of which is incorporated herein in its entirety by reference.

TECHNICAL FIELD

The present disclosure relates to a plasma processing apparatus and a plasma processing method.

BACKGROUND

Japanese Patent Laid-Open Publication No. 2019-067503 proposes, for example, an inductively coupled plasma (ICP) apparatus that includes two radio-frequency power supplies to supply radio-frequency powers of two frequencies to an antenna above a chamber and a lower electrode (susceptor). Of the two radio-frequency power supplies, one radio-frequency power supply supplies a bias radio-frequency power having a frequency of, for example, 13 MHz to the lower electrode. The antenna is provided above the chamber, and the other radio-frequency power supply supplies a radio-frequency power for plasma excitation having a frequency of, for example, 27 MHz to the central point of the line constituting an outer coil of the antenna, or the vicinity thereof.

SUMMARY

According to an aspect of the present disclosure, a plasma processing apparatus includes: a chamber; a first matching circuit and a second matching circuit coupled to the chamber; a first RF generator coupled to the first matching circuit and configured to generate a first RF pulsed signal including a plurality of pulse cycles, each pulse cycle including a first period, a second period, and a third period, the first RF pulsed signal having a first power level in the first period, a second power level in the second period, and a third power level in the third period, and the first period being 30 μs or less; a second RF generator coupled to the second matching circuit and configured to generate a second RF pulsed signal including the plurality of pulse cycles, the second RF pulsed signal having a frequency lower than a frequency of the first RF pulsed signal and having a fourth power level in the first period and a fifth power level in at least one of the second period and the third period; and a third RF generator coupled to the second matching circuit and configured to generate a third RF pulsed signal including the plurality of pulse cycles, the third RF pulsed signal having a frequency lower than the frequency of the second RF pulsed signal and having a sixth power level in the second period and a seventh power level in at least one of the first period and the third period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
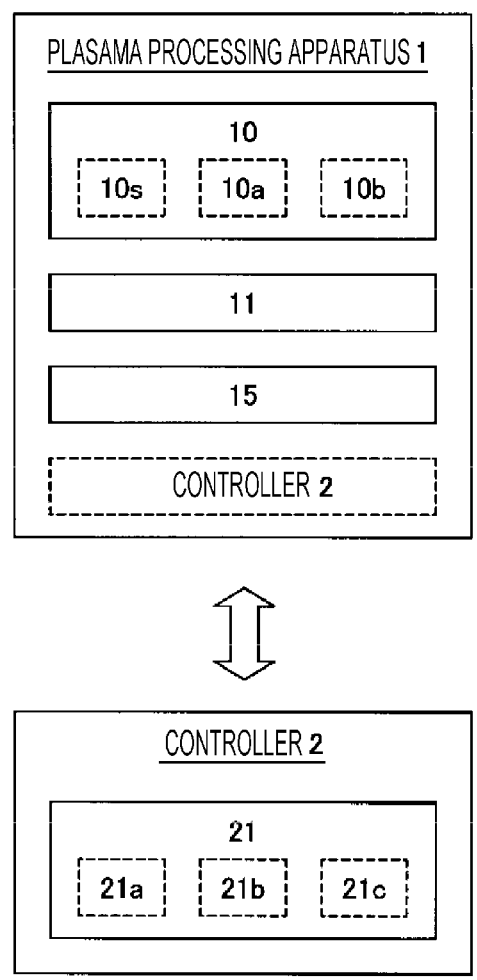
FIG. 1 is a schematic cross-sectional view illustrating an example of a plasma processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In each of the drawings, the same components may be designated by the same reference numerals and duplicate descriptions thereof may be omitted.

[Plasma Processing System]

Figure 2:
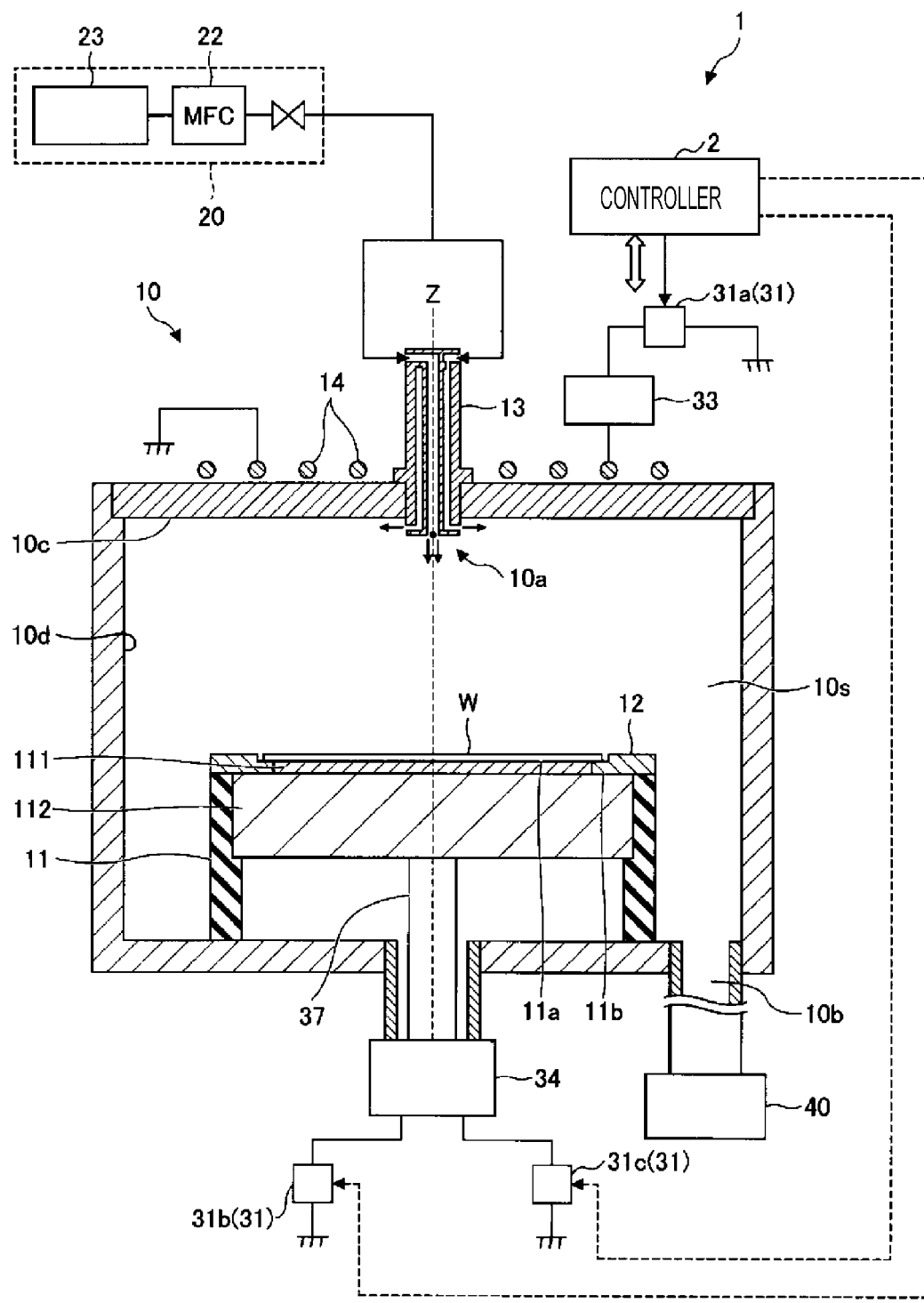
FIG. 2 is a view illustrating an example of a plasma processing apparatus according to the embodiment.

First, a plasma processing system according to an embodiment will be described with reference to FIGS. 1 and 2. FIG. 1 is a schematic cross-sectional view illustrating an example of the plasma processing system according to the embodiment. FIG. 2 is a view illustrating an example of a plasma processing apparatus 1 according to the embodiment.

In the embodiment, the plasma processing system includes a plasma processing apparatus 1 and a controller 2. The plasma processing apparatus 1 is configured to supply three radio-frequency power pulses (three RF pulsed signals) into the chamber 10, thereby generating plasma from a processing gas in a chamber 10. The plasma processing apparatus 1 may be configured to supply two radio-frequency power pulses (two RF pulsed signals) into the chamber 10, thereby generating plasma from the processing gas in the chamber 10. Then, the plasma processing apparatus 1 exposes the generated plasma to a substrate so as to process the substrate.

The plasma processing apparatus 1 includes a chamber 10, a substrate support 11, and a plasma generator. The chamber 10 defines a plasma processing space 10s. Further, the chamber 10 has a gas inlet 10a for supplying at least one processing gas to the plasma processing space 10s, and a gas outlet 10b for discharging the gas from the plasma processing space. The gas inlet 10a is connected to at least one gas supply 20.

The gas outlet 10b is an exhaust port provided, for example, at the bottom of the chamber 10 and is connected to an exhaust system 40. The exhaust system 40 may include a pressure valve and a vacuum pump. The vacuum pump may include a turbo molecular pump, a roughing pump, or a combination thereof.

The substrate support 11 is disposed in the plasma processing space 10s to support a substrate W. The plasma generator is configured to generate plasma from at least one processing gas supplied into the plasma processing space 10s. The plasma formed in the plasma processing space 10s may be capacitively coupled plasma (CCP) or inductively coupled plasma (ICP).

The controller 2 processes computer-executable instructions that cause the plasma processing apparatus 1 to perform the various steps described in the present disclosure. The controller 2 may be configured to control each element of the plasma processing apparatus 1 to perform the various steps described herein. In the embodiment, as illustrated in FIG. 1, a part or all of the controller 2 may be included in the plasma processing apparatus 1. The controller 2 may include, for example, a computer 21. The computer 21 may include, for example, a processing unit (central processing unit (CPU)) 21a, a storage unit 21b, and a communication interface 21c. The processing unit 21a may be configured to perform various control operations based on the program stored in the storage unit 21b. The storage unit 21b may include a random access memory (RAM), a read only memory (ROM), a hard disk drive (HDD), a solid state drive (SSD), or a combination thereof. The communication interface 21c may communicate with the plasma processing apparatus 1 via a communication line such as a local area network (LAN).

Hereinafter, a configuration example of the plasma processing apparatus 1 will be further described by taking the inductively coupled plasma processing apparatus of FIG. 2 as an example. The plasma processing apparatus 1 includes a chamber 10. The chamber 10 includes a dielectric window 10c and a side wall 10d. The dielectric window 10c and the side wall 10d define the plasma processing space 10s in the chamber 10. Further, the plasma processing apparatus 1 includes a substrate support 11, a gas introduction unit 13, a gas supply 20, a power supply, and an antenna 14.

The substrate support 11 is disposed in the plasma processing space 10s within the chamber 10. The antenna 14 is disposed in the upper part of or above the chamber 10 (dielectric window 10c).

The substrate support 11 includes a main body and an annular member (edge ring) 12. The main body has a central region (substrate support surface) 11a for supporting the substrate (wafer) W and an annular region (edge ring support surface) 11b for supporting the annular member 12. The annular region 11b of the main body surrounds the central region 11a of the main body. The substrate W is disposed on the central region 11a of the main body, and the annular member 12 is disposed on the annular region 11b of the main body to surround the substrate W on the central region 11a of the main body. In the embodiment, the main body includes an electrostatic chuck 111 and a conductive member 112. The electrostatic chuck 111 is disposed on the conductive member 112. The conductive member 12 functions as an RF electrode, and the upper surface of the electrostatic chuck 111 functions as a substrate support surface 11a. Although not illustrated, in the embodiment, the substrate support 11 may include a temperature control module configured to adjust at least one of the electrostatic chuck 111 and the substrate W to a target temperature. The temperature control module may include a heater, a flow path, or a combination thereof. A temperature control fluid such as a coolant or a heat transfer gas flows through the flow path. The chamber 10, the substrate support 11, and the annular member 12 are disposed so that the axes Z coincide with each other with the axis Z as the central axis.

The gas introduction unit 13 is configured to supply at least one processing gas from the gas supply 20 to the plasma processing space 10s. In the embodiment, the gas introduction unit 13 is disposed above the substrate support 11 and is attached to a central opening formed in the dielectric window 10c.

The gas supply 20 may include at least one gas source 23 and at least one flow rate controller 22. In the embodiment, the gas supply 20 is configured to supply one or more processing gases from the corresponding gas sources 23 to the gas introduction unit 13 via the corresponding flow rate controllers 22. Each flow rate controller 22 may include, for example, a mass flow controller or a pressure-controlled flow rate controller. Further, the gas supply 20 may include one or more flow rate modulation devices that modulate or pulse the flow rates of one or more processing gases.

The power supply includes an RF power supply 31 coupled to the chamber 10. The RF power supply 31 is configured to supply three RF signals (RF power) to the conductive member 112 or the antenna 14 of the substrate support 11. As a result, plasma is generated from at least one processing gas supplied to the plasma processing space 10s. Further, the plasma generator may be configured to include a gas supply 20 for supplying at least one processing gas in the plasma processing space 10s and an RF power supply 31, and generate plasma from the processing gas.

The antenna 14 includes one or more coils. In the embodiment, the antenna 14 may include an outer coil and an inner coil coaxially arranged. In this case, the RF power supply 31 may be connected to both the outer coil and the inner coil, or may be connected to either the outer coil or the inner coil. In the former case, the same RF generator may be connected to both the outer and inner coils, or separate RF generators may be connected to the outer and inner coils separately.

In the embodiment, the RF power supply 31 includes a source RF generator 31a, a first bias RF generator 31b, and a second bias RF generator 31c. The source RF generator 31a is coupled to the antenna 14, and the first bias RF generator 31b and the second bias RF generator 31c are coupled to the conductive member 112. The source RF generator 31a is configured to be connected to the antenna 14 via the first matching circuit 33, and generate a first RF pulsed signal (hereinafter, also referred to as an HF power) for plasma generation. In the embodiment, the first RF pulsed signal has frequencies in the range of 20 MHz to 60 MHz. The generated first RF pulsed signal is supplied to the antenna 14. The first RF pulsed signal includes a plurality of pulse cycles, each of which includes a first period, a second period, and a third period. The first RF pulsed signal has a first power level in the first period, a second power level in the second period, and a third power level in the third period, and the first period is 30 μs or less. The first RF pulsed signal has at least three power levels, each of which is zero or more. Therefore, the first RF pulsed signal may have High/Middle/Low power levels, which are larger than zero. Further, the first RF pulsed signal may have High/Low power levels and a zero power level (OFF). The source RF generator 31a is an example of a first RF generator coupled to the first matching circuit 33 and configured to generate a first RF pulsed signal including a plurality of pulse cycles.

The first bias RF generator is configured to be connected to the conductive member 112 of the substrate support 11 via a second matching circuit 34 and a feeding line 37, and generate a second RF pulsed signal (hereinafter, also referred to as an LF1 power). The generated second RF pulsed signal is supplied to the conductive member 112 of the substrate support 11. In the embodiment, the second RF pulsed signal has a lower frequency than that of the first RF pulsed signal. In the embodiment, the second RF pulsed signal has frequencies in the range of 1 MHz to 15 MHz. The second RF pulsed signal has a fourth power level in the first period and a fifth power level in at least one of the second period and the third period. Therefore, the second RF pulsed signal may have High/Low power levels, which are larger than zero. The second RF pulsed signal may also have a power level larger than zero and a zero power level, that is, an ON/OFF signal. The first bias RF generator is an example of a second RF generator coupled to the second matching circuit 34 and configured to generate a second RF pulsed signal including a plurality of pulse cycles.

Further, the second bias RF generator is configured to be connected to the conductive member 112 of the substrate support 11 via the second matching circuit 34 and the feeding line 37, and generate a third RF pulsed signal (hereinafter, also referred to as an LF2 power). The generated third RF pulsed signal is supplied to the conductive member 112 of the substrate support 11. In the embodiment, the third RF pulsed signal has a lower frequency than that of the second RF pulsed signal. In the embodiment, the third RF pulsed signal has frequencies in the range of 100 kHz to 4 MHz. The third RF pulsed signal has a sixth power level in the second period and a seventh power level in at least one of the first period and the third period. The third RF pulsed signal has at least two power levels, each of which is zero or more. Therefore, the third RF pulsed signal may have High/Low power levels, which are larger than zero. The third RF pulsed signal may also have a power level larger than zero and a zero power level, that is, an ON/OFF signal. The second bias RF generator is an example of a third RF generator coupled to the second matching circuit 34 and configured to generate a third RF pulsed signal including a plurality of pulse cycles.

In this way, the first RF pulsed signal, the second RF pulsed signal, and the third RF pulsed signal are pulsed. The second RF pulsed signal and the third RF pulsed signal are pulsed between the ON and OFF states, or between two or more different ON states (High/Low). The first RF pulsed signal is pulsed between two or more different ON states (High/Low) and OFF states, or between three or more different ON states (High/Middle/Low). The first RF pulsed signal may be pulsed between the ON and OFF states, or between two different ON states (High/Low).

The first matching circuit 33 is connected to the source RF generator 31a and the antenna 14, and connected to the chamber 10 via the antenna 14. The first matching circuit 33 enables the first RF pulsed signal to be supplied from the source RF generator 31a to the antenna 14 via the first matching circuit 33. Further, the first matching circuit 33 may be connected to a component other than the antenna 14 in other plasma processing apparatuses. For example, in a capacitively coupled plasma processing apparatus including two opposing electrodes, the first matching circuit 33 may be connected to one of the two electrodes.

The second matching circuit 34 is connected to the first bias RF generator 31b, the second bias RF generator 31c, and the substrate support 11 (conductive member 112). The second matching circuit 34 enables the second RF pulsed signal to be supplied from the first bias RF generator 31b to the substrate support 11 via the second matching circuit 34. Further, the second matching circuit 34 enables the third RF pulsed signal to be supplied from the second bias RF generator 31c to the substrate support 11 via the second matching circuit 34.

The controller 2 outputs a control signal instructing the supply of each pulsed signal to each of the source RF generator 31a, the first bias RF generator 31b, and the second bias RF generator 31c. As a result, the first RF pulsed signal, the second RF pulsed signal, and the third RF pulsed signal including the plurality of pulse cycles are supplied at predetermined timings, and plasma is generated from the processing gas in the chamber 10. Then, the substrate processing is performed by exposing the generated plasma to the substrate. This improves the effectiveness of the process and enables a highly accurate substrate processing. Descriptions will be made hereafter on the control timing of the ON/OFF state of the first RF pulsed signal, the second RF pulsed signal, and the third RF pulsed signal or the power level of 0 or more by the controller 2.

[Example of Internal Configuration of Second Matching Circuit]

Figure 3:
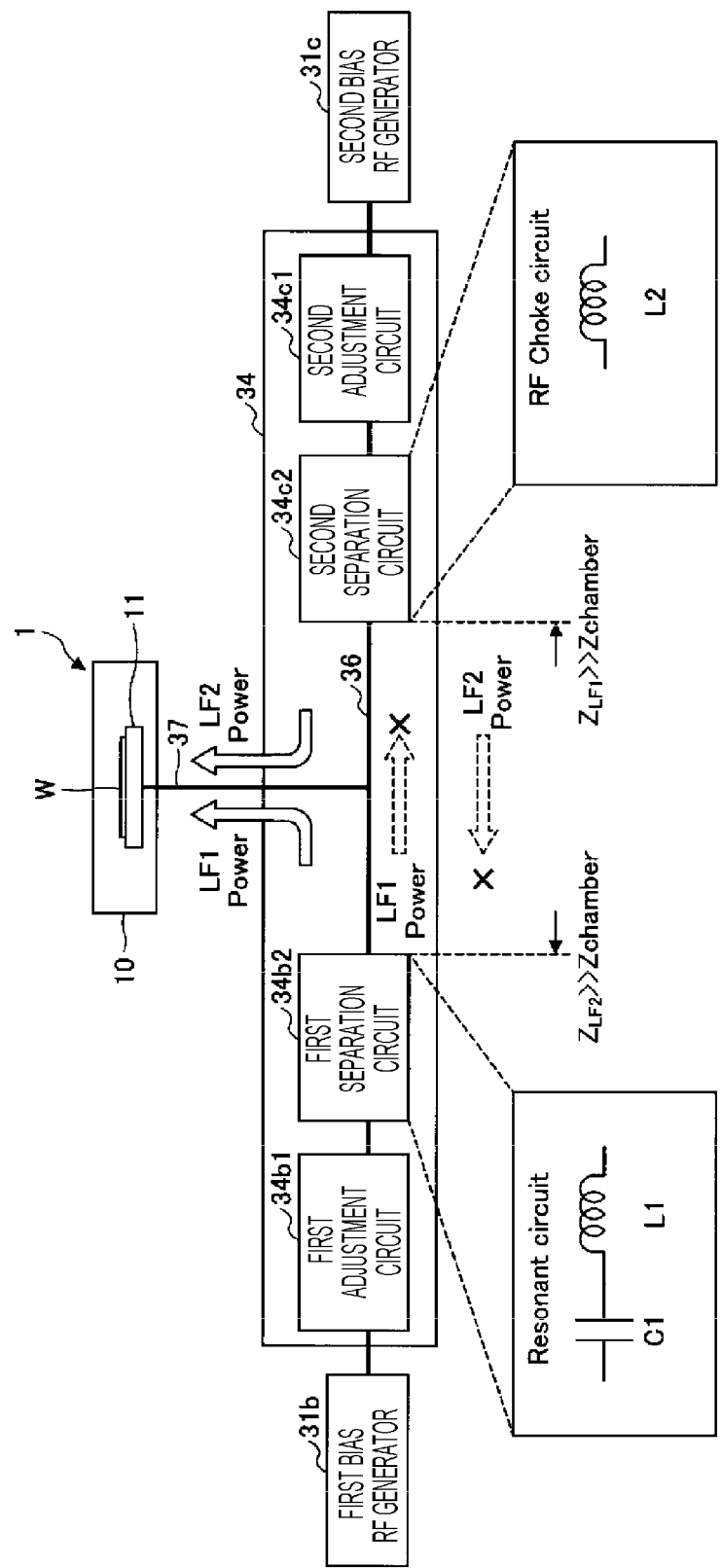
FIG. 3 is a view illustrating an example of a matching circuit of two bias RF pulsed signals according to the embodiment.

Next, an example of the configuration of a second matching circuit 34 will be described with reference to FIG. 3. FIG. 3 is a view illustrating an example of the internal configuration of the second matching circuit 34 according to the embodiment.

A first bias RF generator 31b and a second bias RF generator 31c are connected to a substrate support 11 (conductive member 112) via the second matching circuit 34 and a feeding line 37. The second RF pulsed signal supplied from the first bias RF generator 31b is also referred to as an LF1 power in the following description. Further, the third RF pulsed signal supplied from the second bias RF generator 31c is also referred to as an LF2 power in the following description.

When the second RF pulsed signal (LF1 power) supplied from the first bias RF generator 31b is coupled to the opposite side (the second bias RF generator 31c side) via the feeding line 36 in the second matching circuit 34, the supply efficiency of the LF1 power supplied to the chamber 10 is reduced. Similarly, when the third RF pulsed signal (LF2 power) supplied from the second bias RF generator 31c is coupled to the opposite side (the first bias RF generator 31b side) via the feeding line 36, the supply efficiency of the LF1 power supplied to the chamber 10 is reduced. Then, since the supply of the bias power to the chamber 10 is reduced, it becomes difficult to control the ion energy, and the process performance is deteriorated.

Therefore, the second matching circuit 34 according to the present embodiment includes a first adjustment circuit 34b1, a first separation circuit 34b2, a second adjustment circuit 34c1, and a second separation circuit 34c2. The first adjustment circuit 34b1 and the first separation circuit 34b2 are connected between the first bias RF generator 31b and the feeding line 37. The second adjustment circuit 34c1 and the second separation circuit 34c2 are connected between the second bias RF generator 31c and the feeding line 37. According to this configuration, the second RF pulsed signal (LF1 power) generated by the first bias RF generator 31b is supplied to the substrate support 11 (conductive member 112) while suppressing coupling to the second bias RF generator 31c. Further, the third RF pulsed signal (LF2 power) generated by the second bias RF generator 31c is supplied to the substrate support 11 (conductive member 112) while suppressing coupling to the first bias RF generator 31b.

The first adjustment circuit 34b1 has a variable element and is configured to match the impedance of the load side (substrate support 11) of the first bias RF generator 31b with the output impedance of the first bias RF generator 31b. In the embodiment, the variable element of the first adjustment circuit 34b1 is a variable capacitor.

The second separation circuit 34c2 is connected between the second bias RF generator 31c and the substrate support 11 to suppress coupling of the second RF pulsed signal, which is the LF1 power from the first bias RF generator 31b.

The second adjustment circuit 34c1 has a variable element and is configured to match the impedance of the load side (substrate support 11) of the second bias RF generator 31c with the output impedance of the second bias RF generator 31c. In the embodiment, the variable element of the second adjustment circuit 34c1 is a variable capacitor.

The first separation circuit 34b2 is connected between the first bias RF generator 31b and the substrate support 11 to suppress coupling of the third RF pulsed signal, which is the LF2 power from the second bias RF generator 31c.

The second separation circuit 34c2 is an RF choke circuit including an inductor L2. The first separation circuit 34b2 is a resonance circuit including a capacitor C1 and an inductor L1. The first separation circuit 34b2 is constituted by the capacitor C1 and the inductor L1. The second separation circuit 34c2 is constituted by the inductor L2.

The first separation circuit 34b2 sets the circuit constants of C1 and L1 so that the impedance is illustrated to be 0 or close to 0 from the second RF pulsed signal, the impedance is high from the third RF pulsed signal, and the first bias RF generator 31b is viewed as a wall. As a result, when the impedance seen from the third RF pulsed signal in the first separation circuit 34b2 is expressed as $Z_{LF2}$ and the load impedance of plasma is expressed as $Z_{chamber}$, $Z_{LF2} \gg Z_{chamber}$ is established.

Further, the second separation circuit 34c2 sets the circuit constant of L2 so that the impedance is illustrated to be 0 or close to 0 from the third RF pulsed signal, the impedance is high from the second RF pulsed signal, and the second bias RF generator 31c is viewed as a wall. As a result, when the impedance seen from the second RF pulsed signal in the second separation circuit 34c2 is $Z_{LF1}$, $Z_{LF1} \gg Z_{chamber}$ is established.

By setting the circuit constant of the first separation circuit 34b2 as described above, the impedance $Z_{LF2}$ of the first separation circuit 34b2 becomes much larger than the load impedance $Z_{chamber}$ of plasma. As a result, the first separation circuit 34b2 suppresses the coupling of the third RF pulsed signal from the second bias RF generator 31c (see "LF2 Power→x" in FIG. 3). As a result, the LF2 power is supplied into the chamber 10 via the feeding line 37, which may suppress a decrease in the supply efficiency of the LF2 power.

Similarly, by setting the circuit constant of the second separation circuit 34c2 as described above, the impedance $Z_{LF1}$ of the second separation circuit 34c2 becomes much larger than the load impedance $Z_{chamber}$ of plasma. Thus, the second separation circuit 34c2 suppresses the coupling of the second RF pulsed signal from the first bias RF generator 31b (see "LF1 Power→x" in FIG. 3). As a result, the LF1 power is supplied into the chamber 10 via the feeding line 37, which may suppress a decrease in the supply efficiency of the LF1 power.

With this configuration, pulsed signals of two bias powers (LF1 power and LF2 power) having different frequencies may be efficiently supplied to the substrate support 11.

[Pulsed Signal]

For example, in the case of a process of etching a deep hole having a high aspect ratio, pulsed signals of HF power, LF1 power, and LF2 power may be used to make the incidence angle of ions vertical and increase the mask selection ratio.

Figure 4:
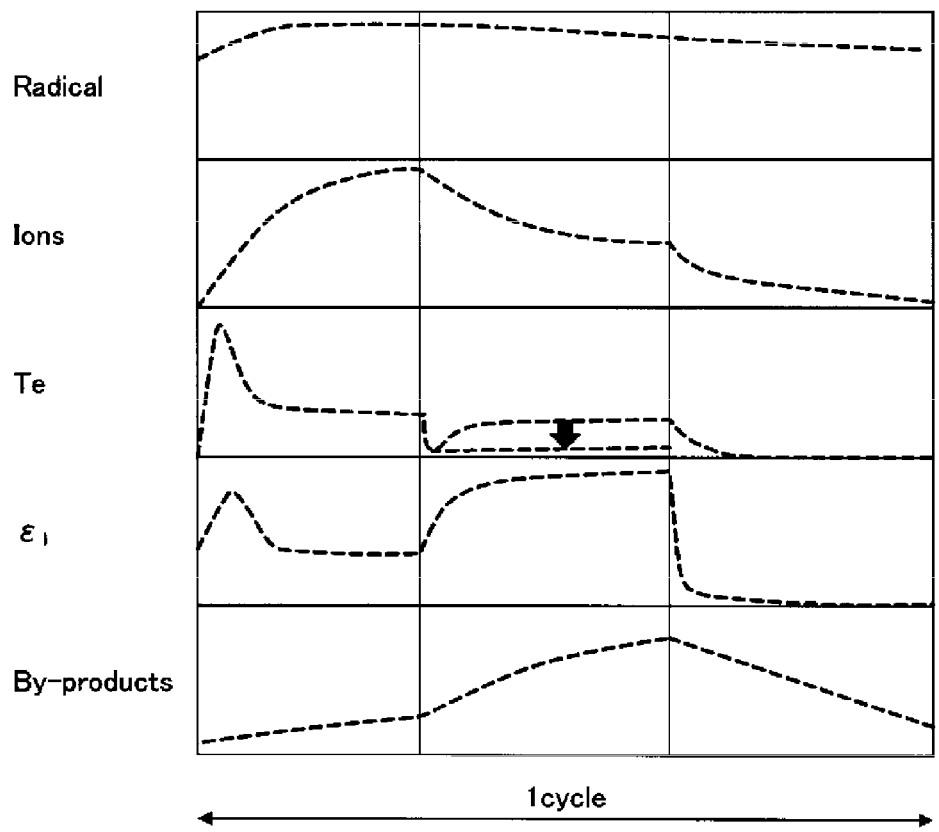
FIG. 4 is a view illustrating examples of radicals, ions, electron temperature, ion energy, and by-products.

FIG. 4 is a view illustrating examples of radicals, ions, electron temperature, ion energy, and by-products. The horizontal axis of FIG. 4 represents the elapsed time (1 cycle) after the supply of RF power is stopped (turned OFF). The vertical axis of FIG. 4 represents the states of radicals (Radical), ions (Ions), electron temperature (Te), ion energy ($\varepsilon_1$), and by-products (By-products) in each time from the OFF time.

Accordingly, the change of radicals after the RF power is turned OFF is gentle, whereas the change of ions (Ions) and plasma temperature (Te) after turning OFF the RF power is faster than the change of the radicals. The pulsed signals of HF power and LF power (e.g., LF1 power and LF2 power) are controlled in consideration of the attenuation of radicals and ions in plasma and the change in energy. As an example of the pulsed signal of the LF power supplied after the HF power is turned OFF, a control is conceivable in which the LF power is turned OFF during the initial time when the plasma temperature (Te) is high, and the LF power is turned ON after the plasma temperature (Te) is lowered. Accordingly, in the time when the ions still remain, but the plasma temperature (Te) is low, the ions may be efficiently drawn into the substrate by using the LF power.

As another example of the pulsed signal of the LF power supplied after the HF power is turned OFF, $\varepsilon_1$ indicating ion energy is used as a plasma parameter, and the LF2 power is controlled in the time when the plasma electron temperature (Te) hardly changes. Thus, the ion energy $\varepsilon_1$ may be controlled to control the incidence angle of the ions more vertically.

In this way, the timing at which the HF power and the LF power are turned ON/OFF is finely controlled according to the movement of plasma parameters such as radicals, ions, plasma electron temperature, ion energy, and by-products. As a result, the performance of the process may be improved. Hereinafter, the supply timing of the pulsed signal of radio-frequency power will be described with reference to FIGS. 5 and 6. Further, the supply timing of the pulsed signal of the radio-frequency power is controlled by the controller 2.

(Pulsed Signal of Two Frequencies)

Figure 5:
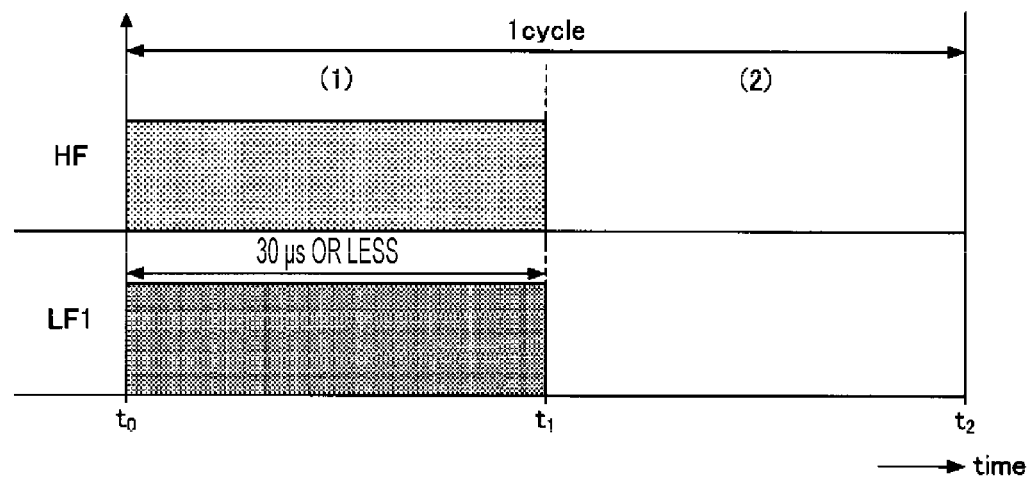
FIG. 5 is a view illustrating a pulse pattern of a radio-frequency power pulse of two frequencies according to the embodiment.

FIG. 5 is a view illustrating a pulse pattern of a radio-frequency power pulse of two frequencies according to the embodiment. Each of the pulsed signals of HF power (source power) and LF1 power (bias power), which are radio-frequency power pulses of two frequencies illustrated in FIG. 5, includes a plurality of pulse cycles. Hereinafter, the supply timing of each pulsed signal will be described. The horizontal axis of FIG. 5 indicates the time of one cycle, and the vertical axis indicates the ON/OFF state of the HF power and the LF1 power. The control of each pulsed signal of the HF power and the LF1 power is repeated by taking the period (1) and the period (2) as one cycle.

In the control of the radio-frequency power pulse of two frequencies, the ON state of the HF power and the ON state of the LF1 power overlap with each other in time, and while the HF power is turned on, the LF1 power is turned on, and while the HF power is turned OFF, the LF1 power is turned OFF. The source RF generator 31a is configured to generate a first RF pulsed signal (HF power), and in the present embodiment, the first RF pulsed signal has two power levels (ON/OFF). For example, the first RF pulsed signal may have a frequency of 27 MHz.

The first bias RF generator 31b is configured to generate a second RF pulsed signal (LF1 power), and in the present embodiment, the second RF pulsed signal has two power levels (ON/OFF). The frequency of the second RF pulsed signal is lower than the frequency of the first RF pulsed signal. For example, the second RF pulsed signal has a frequency of 13 MHz.

During the period (1) of FIG. 5, the HF power and the LF1 power are maintained in the ON state. That is, at time $t_0$, the HF power and the LF1 power shift to the ON state, and at time $t_1$, the HF power and the LF1 power shift to the OFF state. As a result, during the time from time $t_0$ to time $t_1$, plasma containing radicals and ions is generated by the supply of HF power. Also, by supplying LF1 power, the ion flux (the amount of ions) that reaches the bottom of a recess to be etched is controlled, and an etching is promoted.

At time $t_1$ after the period (1), the HF power and the LF1 power shift to the OFF state, and in the period (2), the HF power and the LF1 power are maintained in the OFF state. Since the HF power is in the OFF state in the period (2), radicals, ions, and plasma temperatures are attenuated with their respective time constants, as illustrated in FIG. 4 as an example. Further, in the period (2), since the HF power and the LF1 power are in the OFF state, the by-products are exhausted. The period (2) indicating the exhaust period is preset to a time during which the by-products do not adhere to the substrate W.

At time $t_2$ when the exhaust period has elapsed, the period (2) returns to the period (1), and at time $t_0$, the HF power and the LF1 power shift to the ON state again. The control of each pulsed signal of the HF power and the LF1 power is repeated by taking the period (1) and the period (2) as one cycle. One cycle is 10 kHz to 20 kHz. The plurality of pulse cycles have the same time period, and each pulse cycle has a time period of 50 μs to 100 μs. That is, one cycle of the pulse cycle is 50 μs to 100 μs.

In this example, the first bias RF generator 31b is configured to synchronize the timing of the change in the power level of the second RF pulsed signal with the timing of the change in the power level of the first RF pulsed signal.

Further, the period (1) is set to 30 μs or less. The next period (2) is set to an arbitrary time and may be longer than 30 μs. That is, in this example, the HF power and the LF1 power are maintained in the ON state for a time of 30 μs or less in the period (1), are maintained in the OFF state for an arbitrary time in the period (2), and are repeatedly turned ON and OFF. In this way, by setting the supply time of the LF1 power in one cycle to 30 μs or less, the ions may be controlled vertically and etching with high anisotropy becomes possible.

The power level of the HF power in the period (1) is an example of the first power level, and the power level of the HF power in the period (2) is an example of the second power level. The power level of the LF1 power in the period (1) is an example of the third power level, and the power level of the LF1 power in the period (2) is an example of the fourth power level.

(Pulsed Signal of Three Frequencies)

Figure 6:
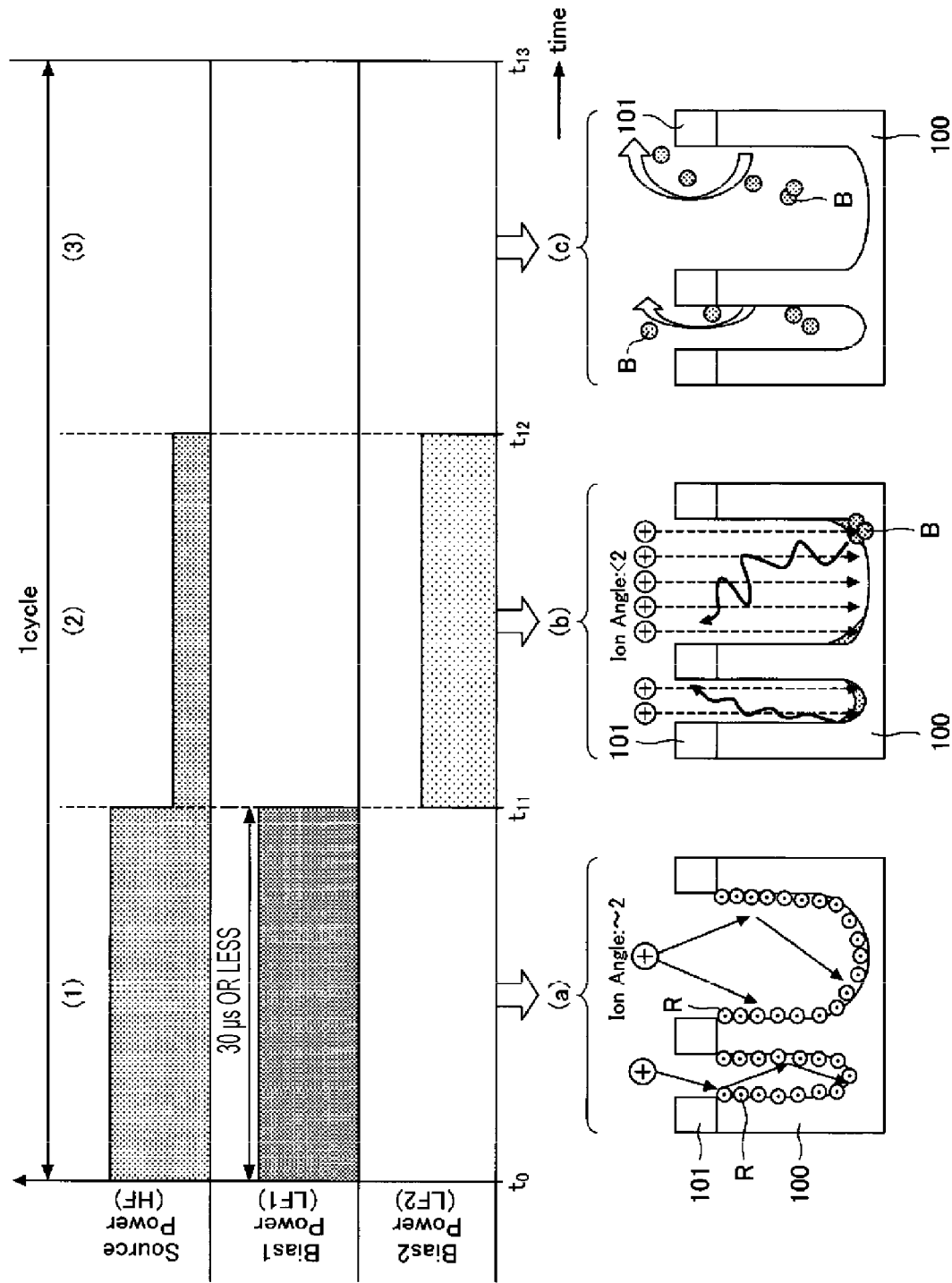
FIG. 6 is a view illustrating a pulse pattern of a radio-frequency power pulse of three frequencies according to the embodiment.

FIG. 6 is a view illustrating a pulse pattern of a radio-frequency power pulse of three frequencies according to the embodiment. First, each of the pulsed signals of HF power (source power), LF1 power (bias 1 power), and LF2 power (bias 2 power), which are radio-frequency power pulses of three frequencies illustrated in FIG. 6, includes a plurality of pulse cycles. Hereinafter, the supply timing of each pulsed signal will be described. The horizontal axis of FIG. 6 indicates the time of one cycle, and the vertical axis indicates the ON/OFF state of the HF power, the LF1 power, and the LF2 power. The control of each pulsed signal of the HF power, LF1 power, and LF2 power is repeated by taking the periods (1) to (3) as one cycle.

In the control of the radio-frequency power pulse of three frequencies, the ON state of the LF1 power and the ON state of the LF2 power do not overlap with each other in time, and while the LF1 power is turned ON, the LF2 power is turned OFF, and while the LF1 power is turned OFF, the LF2 power is turned ON. The ON state of the HF power, the ON state of the LF1 power, the ON state of the HF power, and the ON state of the LF2 power may or may not overlap with each other in time.

The source RF generator 31a is configured to generate a first RF pulsed signal (HF power), and in the present embodiment, the first RF pulsed signal has three power levels (High/Low/OFF). These power levels may be arbitrarily set and changed according to a target process. For example, the first RF pulsed signal has a frequency of 27 MHz.

The first bias RF generator 31b is configured to generate a second RF pulsed signal (LF1 power), and in the present embodiment, the second RF pulsed signal has two power levels (ON/OFF). That is, the second RF pulsed signal has two or more power levels that include a zero power level. The frequency of the second RF pulsed signal is lower than the frequency of the first RF pulsed signal. For example, the second RF pulsed signal has a frequency of 13 MHz.

The second bias RF generator 31c is configured to generate a third RF pulsed signal (LF2 power), and in the present embodiment, the third RF pulsed signal has two power levels (ON/OFF). That is, the third RF pulsed signal has two or more levels that include a zero power level. The frequency of the third RF pulsed signal is lower than the frequency of the second RF pulsed signal. For example, the third RF pulsed signal has a frequency of 1.2 MHz.

In FIG. 6, the Source Power (HF power) represents the state of the first RF pulsed signal, the Bias Power1 (LF1 power) represents the state of the second RF pulsed signal, and the Bias Power2 (LF2 power) represents the state of the third RF pulsed signal.

In the period (1) of FIG. 6, the HF power has a High power level, the LF1 power is in the ON state, and the LF2 power is in the OFF state. That is, during time $T_s$ from time $t_0$ to time $t_{11}$, plasma containing radicals and ions is generated by the supply of HF power. Further, during the time from time $t_0$ to time $t_{11}$, the ion flux (the amount of ions) that reaches the bottom of the recess to be etched may be controlled by supplying the LF1 power, and the etching may be promoted. Accordingly, as illustrated in FIG. 6A, an etching target film 100 is etched through a mask 101, and the radical R mainly adheres to the inner wall of a hole HL formed in the etching target film 100. Also, by controlling the ions, the ion flux that reaches the bottom of the etched recesses is controlled.

Further, the period (1) is set to 30 μs or less. The next periods (2) and (3) are set to an arbitrary time and may be longer than 30 μs. That is, in this example, the HF power and the LF1 power are maintained in the ON state for a time of 30 μs or less in the period (1). In this way, by supplying the LF1 power for a short time of 30 μs or less in the period (1), the ions are further vertically controlled, and highly anisotropic etching becomes possible.

After the lapse of the period (1), at time $t_{11}$, the HF power shifts from the High power level to the Low power level (or the OFF state), the LF1 power shifts to the OFF state, and the LF2 power shifts to the ON state. Then, as illustrated in FIG. 4, the radicals, ions, and plasma temperatures are attenuated with their respective time constants. Depending on the attenuation state of these plasma parameters, the timing of turning ON the LF2 power is controlled during the period (2) in which the power level of the HF power is lowered or controlled to the OFF state and the period (3) in which the by-products are exhausted.

In the present embodiment, during the period (2), the HF power is maintained at the Low power level, the LF 1 power is maintained in the OFF state, and the LF2 power is maintained in the ON state. In the period (2), the LF2 power having a frequency lower than the frequency of the LF1 power supplied in the period (1) is supplied. The Vpp of the LF2 power is larger than the Vpp of the LF1 power. Thus, since in the period (2), the Vpp of the bias voltage may be made larger than that in the period (1), the ion energy Et may be made larger, and the incidence angle of ions may be controlled more vertically. As a result, the ion flux that reaches the bottom of the etched recess in the period (2) may be controlled. As illustrated in FIG. 6B, the by-products B remaining at the corners of the bottom of the hole HL are etched, and the etching may be promoted.

At time $t_{12}$, the HF power shifts to the OFF state (or to the Low power level), the LF1 power is maintained in the OFF state, and the LF2 power shifts to the OFF state. The period (3) controls the exhaust of by-products. That is, in the period (3), the HF power, the LF1 power, and the LF2 power are maintained in the OFF state. Thus, as illustrated in FIG. 6C, the by-products B adhering to the hole HL are exhausted. This may accelerate the etching of the next cycle. The period (3) is preset to the time during which the by-products B are not reattached to the substrate W.

At time $t_{13}$, returning to the period (1), the HF power shifts to the High power level, the LF1 power shifts to the ON state, and the LF2 power is maintained in the OFF state. The periods (1) to (3) are repeated, one cycle is 10 kHz to 20 kHz, and the period (1) is 30 us or less. Each of the plurality of pulse cycles is 50 us to 100 μs.

In this way, in the process of etching a deep hole having a high aspect ratio, the pulsed signals of the HF power, the LF1 power, and the LF2 power may be used to increase the mask selection ratio and make the incidence angle of the ions vertical. As a result, the etching shape may be made vertical and the etching may be promoted. However, the process of etching a deep hole having a high aspect ratio is an example of a substrate processing, and the type of process is not limited thereto.

In the example of FIG. 6, the power level of the HF power is controlled to the three levels, and the power levels of the LF1 power and the LF2 power are controlled to the two levels in the ON/OFF state. However, the present disclosure is not limited thereto. For example, the power level of HF power may be controlled to four levels or more.

Further, the power level of the HF power in the period (1) is an example of the first power level, the power level of the HF power in the period (2) is an example of the second power level, and the power level of the HF power in the period (3) is an example of the third power level. The power level of the LF1 power in the period (1) is an example of the fourth power level, and the power level of the LF1 power in the period (2) and/or the period (3) is an example of the fifth power level. The power level of the LF2 power in the period (2) is an example of the sixth power level, and the power level of the LF1 power in the period (1) and/or the period (3) is an example of the seventh power level.

As described above, according to the plasma processing apparatus and the plasma processing method of the present embodiment, it is possible to improve the performance of a process by using a plurality of radio-frequency power pulsed signals.

According to an aspect, the performance of a process may be improved by using a plurality of radio-frequency power pulsed signals.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a first matching circuit coupled to the chamber;
a second matching circuit coupled to the chamber;
a first RF generator coupled to the first matching circuit, and configured to generate a first RF pulsed signal including a plurality of pulse cycles, each pulse cycle including a first period, a second period, and a third period, the first RF pulsed signal having a first power level in the first period, a second power level in the second period, and a third power level in the third period, and the first period being 30 μs or less;
a second RF generator coupled to the second matching circuit, and configured to generate a second RF pulsed signal including the plurality of pulse cycles, the second RF pulsed signal having a frequency lower than a frequency of the first RF pulsed signal and having a fourth power level in the first period and a fifth power level in at least one of the second period and the third period; and
a third RF generator coupled to the second matching circuit, and configured to generate a third RF pulsed signal including the plurality of pulse cycles, the third RF pulsed signal having a frequency lower than the frequency of the second RF pulsed signal and having a sixth power level in the second period and a seventh power level in at least one of the first period and the third period.

2. The plasma processing apparatus according to claim 1, wherein the second RF pulsed signal has the fifth power level in the second period, and the third RF pulsed signal has the seventh power level in the first period.

3. The plasma processing apparatus according to claim 2, wherein the third power level, the fifth power level, and the seventh power level are zero power levels.

4. The plasma processing apparatus according to claim 3, wherein the first power level is larger than the second power level.

5. The plasma processing apparatus according to claim 4, wherein one cycle of each of the plurality of pulse cycles is 50 μs to 100 μs.

6. The plasma processing apparatus according to claim 5, wherein the first RF pulsed signal has a frequency of 20 MHz to 60 MHz, the second RF pulsed signal has a frequency of 1 MHz to 15 MHz, and the third RF pulsed signal has a frequency of 100 kHz to 4 MHz.

7. The plasma processing apparatus according to claim 6, wherein the third RF pulsed signal has a zero power level during a period when the second RF pulsed signal has a power level larger than zero.

8. The plasma processing apparatus according to claim 1, wherein the third power level, the fifth power level, and the seventh power level are zero power levels.

9. The plasma processing apparatus according to claim 1, wherein the first power level is larger than the second power level.

10. The plasma processing apparatus according to claim 1, wherein one cycle of each of the plurality of pulse cycles is 50 μs to 100 μs.

11. The plasma processing apparatus according to claim 1, wherein the first RF pulsed signal has a frequency of 20 MHz to 60 MHz, the second RF pulsed signal has a frequency of 1 MHz to 15 MHz, and the third RF pulsed signal has a frequency of 100 kHz to 4 MHz.

12. The plasma processing apparatus according to claim 1, wherein the third RF pulsed signal has a zero power level during a period when the second RF pulsed signal has a power level larger than zero.

* * * * *